United States Patent
Li et al.

[11] Patent Number: 5,889,414
[45] Date of Patent: Mar. 30, 1999

[54] PROGRAMMABLE CIRCUITS

[75] Inventors: Li-Chun Li, Los Gatos; Lynne Watters, Sunnyvale; Sharlin Fang, San Jose, all of Calif.

[73] Assignee: Mosel Vitelic Corporation, San Jose, Calif.

[21] Appl. No.: 840,337

[22] Filed: Apr. 28, 1997

[51] Int. Cl.⁶ .................................................. H03K 19/094
[52] U.S. Cl. .......................... 326/49; 326/50; 327/525; 365/230.06
[58] Field of Search .................................. 326/49, 50, 46, 326/10, 12, 13; 327/525; 365/230.06, 225.7

[56] References Cited

U.S. PATENT DOCUMENTS

| | | |
|---|---|---|
| 4,387,503 | 6/1983 | Aswell et al. . |
| 4,404,635 | 9/1983 | Flaker . |
| 4,489,401 | 12/1984 | Smarandoiu . |
| 4,493,804 | 1/1985 | Lee et al. . |
| 4,532,607 | 7/1985 | Uchida . |
| 4,546,455 | 10/1985 | Iwashashi et al. . |
| 4,614,881 | 9/1986 | Yoshida et al. . |
| 4,617,651 | 10/1986 | Ip et al. . |
| 4,684,826 | 8/1987 | France et al. . |
| 4,725,979 | 2/1988 | Hoberman . |
| 4,771,285 | 9/1988 | Agrawal . |
| 4,779,229 | 10/1988 | Agrawal . |
| 4,785,199 | 11/1988 | Kolodny et al. ........................... 326/50 |
| 4,837,520 | 6/1989 | Golke et al. . |
| 4,852,044 | 7/1989 | Turner et al. . |
| 5,066,998 | 11/1991 | Fischer et al. . |
| 5,086,331 | 2/1992 | Hartgring et al. . |
| 5,134,585 | 7/1992 | Murakami et al. . |
| 5,185,291 | 2/1993 | Fischer et al. . |
| 5,258,953 | 11/1993 | Tsujimoto ............................ 365/225.7 |
| 5,387,823 | 2/1995 | Ashizawa ................................. 327/525 |
| 5,440,246 | 8/1995 | Murray et al. . |
| 5,459,684 | 10/1995 | Nakamura et al. .................. 365/225.7 |
| 5,471,431 | 11/1995 | McClure . |
| 5,508,638 | 4/1996 | Cowles et al. ........................... 327/525 |
| 5,551,004 | 8/1996 | McClure . |
| 5,566,107 | 10/1996 | Gilliam .................................... 327/525 |

FOREIGN PATENT DOCUMENTS 288 689 A5  4/1991  Germany .

OTHER PUBLICATIONS

Prince, Betty (Texas Instruments, USA), "Semiconductor Memories: A Handbook of Design, Manufacture and Application" (John Wiley & Sons, 2d Ed.), pp. 762–764 (1991).

*Primary Examiner*—Michael Tokar
*Assistant Examiner*—Daniel D. Chang
*Attorney, Agent, or Firm*—Skjerven Morrill MacPherson Franklin & Friel LLP; Michael Shenker

[57] ABSTRACT

A fuse-programmable circuit controllably enables or disables an electrical signal (S). The circuit includes a transmission gate (118) connected between the circuit's input and output terminals. The transmission gate is controlled by complimentary outputs OUTH, OUTL of a fuse-programmable latch (130). A PMOS transistor (Q41) and a fuse (F41) are connected in series between the output terminal and a power supply voltage (VCC). An NMOS transistor (Q42) and a fuse (F42) are connected in series between the output terminal and a reference voltage (ground). The gate of the PMOS transistor is connected to the latch output OUTH. The gate of the NMOS transistor is connected to the latch output OUTL. When OUTH is high and OUTL is low, the transmission gate couples the signal (S) from the input terminal to the output terminal. When OUTH is low and OUTL is high, the transmission gate is closed. The output terminal is permanently fixed at the power supply voltage level or the reference voltage level depending on which of the two fuses (F41 or F42) is blown and which of the two fuses is intact.

27 Claims, 2 Drawing Sheets

5,889,414

PROGRAMMABLE CIRCUITS

BACKGROUND OF THE INVENTION

The present invention relates to programmable circuits, and more particularly to programmable circuits that can be used to enable or disable electrical signals.

Fuse-programmable circuits have been used to disable select signals to salvage memories having defective memory arrays. More particularly, when a memory die is manufactured and tested and defects are discovered in one of the memory arrays on the die but another one of the memory arrays is defect-free, the die can be salvaged by disabling the defective memory array. This is desirable, in particular, when the defects cannot be fixed by redundant circuitry. The defective memory array is disabled by disabling a select signal S (FIG. 1A) which selects the array in response to address signals. In FIG. 1A, select signal S is an output of an address decoder NAND gate 110. The output of address NAND gate 110 is connected to an input IN of a disabling circuit 114. Circuit 114 includes a transmission gate 118 containing NMOS transistor Q1 and PMOS transistor Q2. These transistors are connected in parallel between input IN and output OUT of circuit 114. The signal S' on output OUT is coupled to the memory array (not shown) through inverter amplifier 122. The gate of NMOS transistor Q1 is connected to output OUTH of fuse programmable latch 130 (FIG. 1B). The gate of PMOS transistor Q2 is connected to complementary output OUTL of latch 130. Output OUTL is also connected to the gate of NMOS transistor Q3 of circuit 114. Transistor Q3 is connected between output OUT and ground.

Latch 130 is described in U.S. Pat. No. 5,440,246 "Programmable Circuit with Fusible Latch" issued Aug. 8, 1995 on an invention of M. Murray et al. In this latch, fuse F1 is connected between a power supply voltage VCC and output OUTH. NMOS transistor Q4 is connected between output OUTH and ground. Fuse F2 is connected between output OUTL and ground. PMOS transistor Q5 is connected between output OUTL and power supply voltage VCC. The gate of transistor Q4 is connected to output OUTL. The gate of transistor Q5 is connected to output OUTH.

When fuses F1 and F2 are intact, the latch output OUTH is high (VCC) and the latch output OUTL is low (ground). When fuses F1 and F2 are blown, output OUTH is low and output OUTL is high.

If the memory array selectable by signal S is not to be disabled (because the memory array has no defects or at least no defects that are not fixed by redundant circuitry), fuses F1 and F2 are left intact. Hence, transmission gate 118 is open, coupling the select signal S to the terminal OUT. Transistor Q3 is off. Therefore, signal S' is enabled to select or deselect the memory array in response to address signals in a normal manner.

If the memory array must be permanently disabled, fuses F1 and F2 are blown. As a result, transmission gate 118 is closed, and transistor Q3 pulls the output OUT to ground.

The same circuit 114, 130 of FIGS. 1A, 1B can be used to always select a non-defective memory array when a defective memory array is disabled.

FIG. 2 illustrates an alternate signal-disabling circuit 210 which can be used instead of circuit 114. Like circuit 114, circuit 210 is controlled by a latch 130 (not shown in FIG. 2). Circuit 210 is identical to circuit 114 except that the transistor Q3 is replaced by a PMOS transistor Q6 connected between output OUT and power supply voltage VCC. The gate of transistor Q6 is connected to output OUTH of latch 130. When fuses F1 and F2 are intact, transmission gate 118 of circuit 210 couples the terminal IN to the terminal OUT, and transistor Q6 is off. When fuses F1 and F2 are blown, transmission gate 118 decouples terminal OUT from terminal IN, and transistor Q6 pulls the output OUT to VCC.

When the die is manufactured, it is not known in advance whether any given memory array will have to be permanently enabled or disabled. Therefore, circuitry is needed that can be programmed to permanently fix the array select signal at either the high or the low voltage level. Such circuitry is shown in FIG. 3. In FIG. 3, circuits 114, 210 are connected in series between an input terminal 310 receiving the select signal S and an output terminal 320 which provides the signal S'. Circuit 114 is controlled by a latch 130.1 which is a copy of the latch 130 (FIG. 1B). Circuit 210 is controlled by another latch 130.2 which is a copy of the latch 130. If the fuses of latches 130.1, 130.2 are intact, then circuits 114, 210 couple the output 320 to the input 310. If the fuses of latch 130.1 are blown and the fuses of latch 130.2 are intact, output 320 is pulled to ground. If the fuses of latch 130.1 are intact and the fuses of latch 130.2 are blown, output 320 is pulled to VCC.

It is desirable to provide a simpler and faster circuit than the circuit of FIG. 3. More particularly, the circuit of FIG. 3 includes 10 transistors (three transistors in each of circuits 114, 210 and two transistors in each of latches 130.1, 130.2). Further, the circuit has a delay through two transmission gates from input 310 to output 320. It is desirable to simplify the circuit and reduce the circuit delay.

SUMMARY OF THE INVENTION

The present invention provides programmable circuits some embodiments of which can be used to enable or disable electrical signals including, but not limited to, memory array select signals. Some embodiments of the invention are simple circuits that have a low delay.

In some embodiments, a first programmable element (for example, a fuse) is connected between an output terminal of the circuit and a first terminal. A second programmable element is connected between the output terminal and a second terminal. In some embodiments, one of the first and second terminals is a power supply terminal, and the other one of the first and second terminals is a reference voltage terminal. Further, in some embodiments, a first variable-impedance device (e.g., a transistor) is connected between the output terminal and the first terminal in series with the first programmable element. A second variable-impedance device is connected between the output terminal and the second terminal in series with the second programmable element. A coupling circuit such as a transistor or a transmission gate is connected between the input and output terminals. A latch, for example, the latch of FIG. 1B, controls the coupling circuit and the variable-impedance devices. If the signal on the input terminal is not to be disabled, the latch is programmed so that the coupling circuit couples the input terminal to the output terminal and both variable-impedance devices are in their high-impedance states. If the signal on the input terminal is to be disabled, then the latch is programmed so that the coupling circuit decouples the input terminal from the output terminal and both variable-impedance devices are in their low-impedance states. One of the two programmable elements is made conductive, while the other programmable element is made non-conductive. Depending on which programmable element is conductive, the output terminal is connected to the first or second terminal. Thus, if one of the first and second terminals is a power supply terminal and the other one of the first and second terminals is a reference voltage terminal, the output terminal is permanently coupled to the power supply terminal or the reference voltage terminal.

In some embodiments, the first and second programmable elements are antifuses, and the variable-impedance devices are omitted.

Other features and advantages of the invention are described below. The invention is defined by the appended claims.

DESCRIPTION OF PREFERRED EMBODIMENTS

Figure 1A:
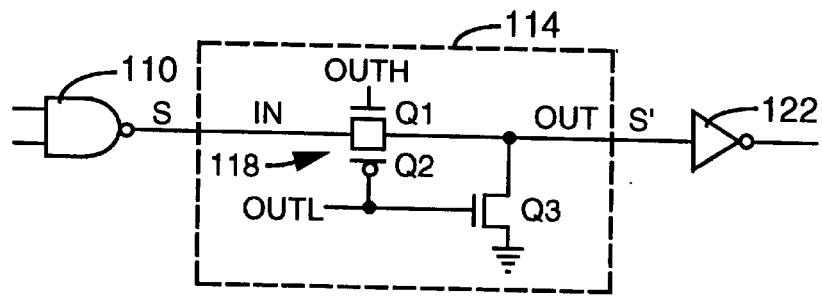
FIGS. 1A, 1B and 2 are circuit diagrams of prior art programmable circuits.
Figure 1B:
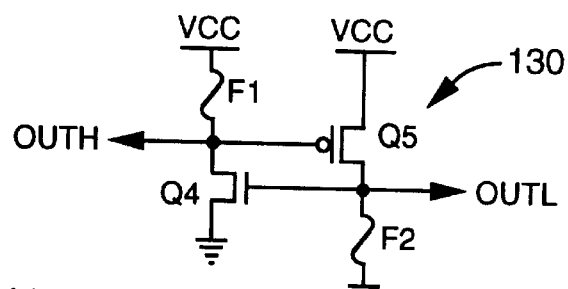
Figure 2:
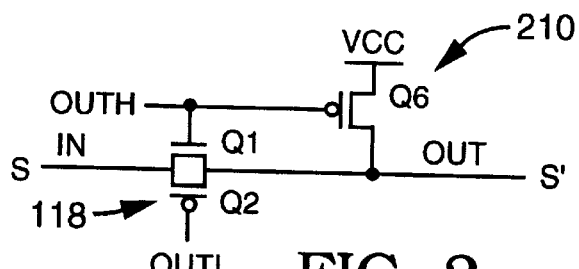
Figure 4:
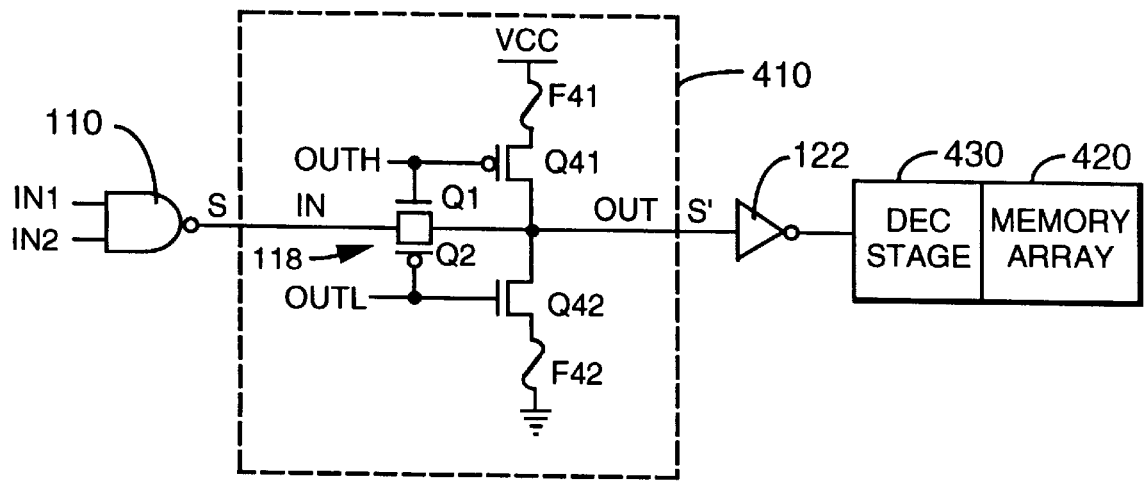
FIG. 4 is a circuit diagram of a programmable circuit according to the present invention.

FIG. 4 illustrates a programmable circuit 410 according to the present invention. Input IN of circuit 410 receives a select signal S which is an output of an address decoder NAND gate 110. Inputs IN1, IN2 of gate 110 are outputs of an address buffer or a predecoder. Input IN of circuit 410 is coupled to output OUT through transmission gate 118. Transmission gate 118 includes NMOS transistor Q1 and PMOS transistor Q2 connected in parallel between the terminals IN and OUT. As in FIG. 1A, the gates of transistors Q1, Q2 are connected to respective outputs OUTH, OUTL of a latch 130 of FIG. 1B (the latch is not shown in FIG. 4).

Output OUTH is connected to the gate of PMOS transistor Q41. The drain of transistor Q41 is connected to output OUT. The source is connected to one terminal of fuse F41. The other terminal fuse F41 is connected to a VCC terminal. Output OUTL of the latch 130 is connected to the gate of NMOS transistor Q42. The drain of transistor Q42 is connected to output OUT. The source is connected to one terminal fuse F42. The other terminal of fuse F42 is connected to a ground terminal.

Output OUT provides select signal S' for a memory array 420. Output OUT is connected to an input of inverter-amplifier 122. The output of inverter 122 is connected to a decoder stage 430. Stage 430 is a stage of a row or column decoder. Decoder stage 430 is connected to memory array 420 as known in the art.

When the fuses F1, F2 of latch 130 are intact, transistors Q41 and Q42 are off. Transmission gate 118 couples the output OUT to the input IN.

When fuses F1 and F2 are blown, transmission gate 118 decouples the output OUT from the input IN, thus disabling the signal S. Transistors Q41 and Q42 are on. If fuse F41 is blown and fuse F42 is intact, transistor Q42 pulls the output OUT to ground. If fuse F42 is blown and fuse F41 is intact, transistor Q41 pulls the output OUT to VCC.

Figure 3:
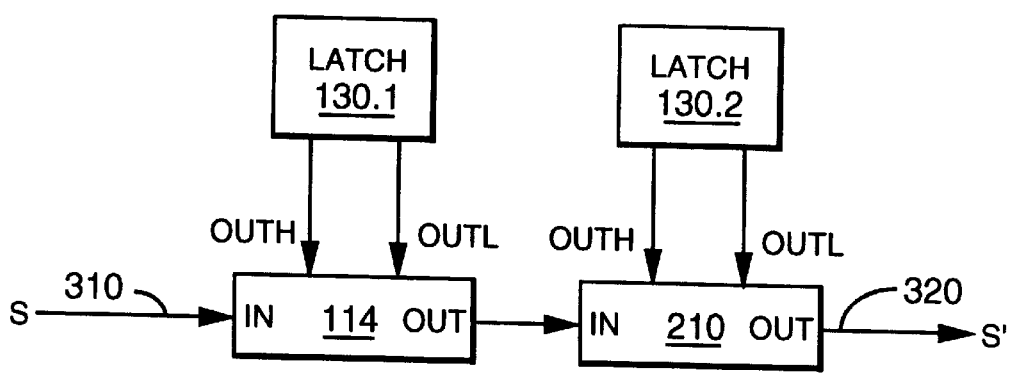
FIG. 3 is a block diagram of a prior art programmable circuit.

Circuit 410 performs the same function as the circuit of FIG. 3, and also has four fuses. However, circuit 410 has only six transistors (including two transistors of latch 130), compared to 10 transistors of the circuit of FIG. 3. Further, circuit 410 has only one transmission gate delay from input IN to output OUT, compared to two transmission gate delays in FIG. 3.

In some embodiments, transistor dimensions in the circuit of FIG. 4 and the respective latch 130 are as follows. All the channel lengths are 1 $\mu$m, unless stated otherwise. The channel widths of transistors Q1, Q2, Q41, Q42 are 4 $\mu$m each. NAND gate 110 and inverter 122 are CMOS circuits. In these circuits, the N channel transistors have a channel width of 15 $\mu$m. The P channel transistors of NAND gate 110 have a channel width of 15 $\mu$m. The P channel transistor of inverter 122 has a channel width of 30 $\mu$m.

The channel widths of transistors Q4, Q5 of latch 130 are each 20 $\mu$m. Each fuse F1, F2, F41, F42 is a laser-programmable polysilicon fuse. VCC is 3.3v or 5.0V.

Figure 5:
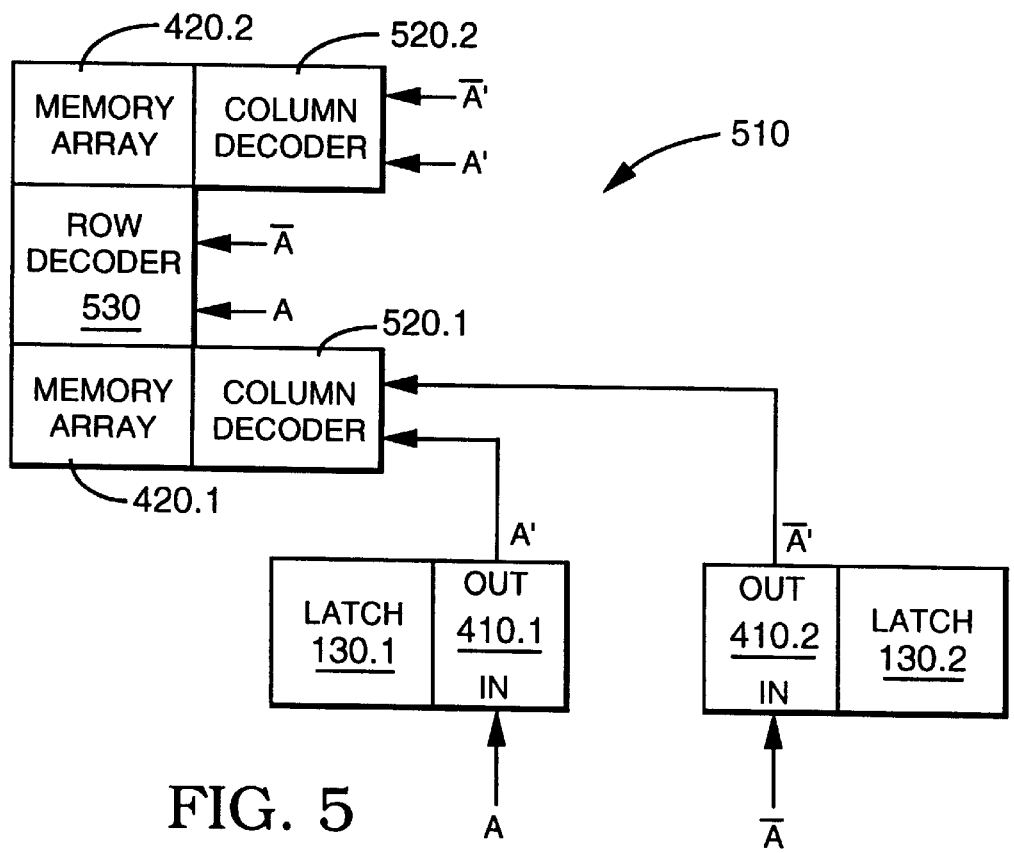
FIG. 5 is a block diagram of a memory according to the present invention.

FIG. 5 is a block diagram of a DRAM (dynamic random access memory) 510 in which any one of memory arrays 420.1, 420.2 can be permanently enabled or disabled. In some embodiments, memory 510 is an 8 Mb memory, and each array 420.1, 420.2 is a 4 Mb array. Array 420.1 is selected by an address signal A. Array 420.2 is selected by the complementary address signal A. Array signals A, A are outputs of an address buffer (not shown) receiving the corresponding external address bit (not shown).

Address signals A, A are delivered to inputs IN of respective circuits 410.1, 410.2 each of which is a copy of circuit 410 of FIG. 4. Circuits 410.1, 410.2 are controlled by respective latches 130.1, 130.2 each of which is a copy of latch 130 of FIG. 1B. Outputs A', $\overline{A}$' on output terminals OUT of respective circuits 410.1, 410.2 are delivered to column decoder 520.1 associated with memory array 420.1 and to column decoder 520.2 associated with memory array 420.2. Address inputs A, $\overline{A}$ are connected to row decoder 530. The same address inputs are used for both the row and column addresses. Column decoders 520.1, 520.2 and row decoder 530 also receive other address signals, either directly or through other circuits 410 (not shown).

In some embodiments, row decoder 530 receives signals A', $\overline{A}$' instead of A, $\overline{A}$, allowing disablement of half of the memory rows.

In some embodiments, memory 510 is an SRAM or some other kind of memory.

The above embodiments illustrate but do not limit the invention. The invention is not limited to any particular circuits or devices, or to laser-programmable or polysilicon fuses. In some embodiments, fuse F41 is connected to terminal OUT, and transistor Q41 is connected between fuse F41 and VCC. In some embodiments, fuse F42 is connected to terminal OUT, and transistor Q42 is connected between fuse F42 and ground. In some embodiments, the ground voltage is replaced by some other reference voltage. In some embodiments, antifuses are used instead of fuses. In some embodiments, fuse F41 is replaced by an antifuse, and transistor Q41 is omitted. In some embodiments, fuse F42 is replaced by an antifuse, and transistor Q42 is omitted. Reversible programmable elements are used as fuses or antifuses in some embodiments. While the circuit of FIG. 4 is implemented in CMOS technology, non-CMOS technology is used in some embodiments. In some embodiments, transmission gate 118 is replaced by a single transistor, that is, one of transistors Q1, Q2 is omitted. The invention is not limited by any transistor dimensions. Further, the invention is not limited to select signals or memories. In some embodiments, circuit 410 is used to disable output signals of other combinational or non-combinational circuits than memory decoder circuits or address buffers. Other embodiments and variations are within the scope of the invention, as defined by the appended claims.

We claim:

1. A circuit comprising:
   one or more first memory cells;
   one or more second memory cells;
   a first terminal;
   a second terminal; and
   a first selection circuit comprising:
   a first output terminal for providing a first signal to select the one or more first cells, wherein when the first signal deselects the one or more first cells, the first signal does not block selection of the one or more second cells;
   a first programmable path connected to the first terminal and the first output terminal, the first programmable path including a first programmable element connected between the first terminal and the first output terminal such that when the first programmable element is conductive, the first programmable path is enabled to connect the first terminal to the first output terminal, and when the first programmable element is non-conductive, the first programmable path is unable to connect the first terminal to the first output terminal; and
   a second programmable path connected to the second terminal and the first output terminal, the second programmable path including a second programmable element connected between the second terminal and the first output terminal such that when the second programmable element is conductive, the second programmable path is enabled to connect the second terminal to the first output terminal, and when the second programmable element is non-conductive, the second programmable path is unable to connect the second terminal to the first output terminal;
   wherein when the first programmable path does not connect the first output terminal to the first terminal and the second programmable path does not connect the first output terminal to the second terminal, the first signal is responsive to one or more address signals to select and deselect the one or more first memory cells in response to the one or more address signals;
   when the first programmable path connects the first output terminal to the first terminal but the second programmable path does not connect the first output terminal to the second terminal, the first signal is operable to select the one or more first memory cells irrespective of the one or more address signals; and
   when the first programmable path does not connect the first output terminal to the first terminal but the second programmable path connects the first output terminal to the second terminal, the first signal is operable to deselect the one or more first memory cells irrespective of the one or more address signals.

2. The circuit of claim 1 wherein one of the first and second terminals is for receiving a power supply voltage, and the other one of the first and second terminals is for receiving a reference voltage.

3. The circuit of claim 1 wherein each of the first and second programmable elements is a fuse.

4. The circuit of claim 1 further comprising:
   a first variable-impedance device connected between the first terminal and the output terminal in series with the first programmable element; and
   a second variable-impedance device connected between the second terminal and the output terminal in series with the second programmable element.

5. The circuit of claim 2 wherein each of the first and second variable-impedance devices is a transistor.

6. The circuit of claim 4 further comprising:
   an input terminal for receiving a signal responsive to the one or more address signals; and
   a coupling circuit for controllably coupling the input terminal to the output terminal, such that when the coupling circuit is enabled, said first signal on the output terminal is responsive to the one or more address signals, and when the coupling circuit is disabled the first signal on the output terminal is not responsive to the one or more address signals.

7. The circuit of claim 6 further comprising a latch programmable by one or more programmable elements, for controlling the coupling circuit and the variable-impedance devices to do either of the following:
   (1) to cause the coupling circuit to couple the output terminal to the input terminal while putting the first and second variable-impedance devices into their respective high-impedance states; or
   (2) to cause the coupling circuit to decouple the output terminal from the input terminal while putting the first and second variable-impedance devices into their respective low-impedance states.

8. The circuit of claim 7 wherein the latch comprises:
   a first output terminal;
   a first programmable element connected between the first output terminal of the latch and a power supply terminal;
   a first transistor connected between the first output terminal of the latch and a reference voltage terminal;
   a second output terminal connected to a control terminal of the first transistor of the latch;
   a second programmable element connected between the second output terminal of the latch and a reference voltage terminal; and
   a second transistor connected between the second output terminal of the latch and a power supply terminal, this transistor having a control terminal connected to the first output terminal of the latch,
   wherein at least one of the first and second terminals of the latch is connected to the coupling device, at least one of the first and second output terminals of the latch is connected to the first variable-impedance device, and at least one of the first and second output terminals of the latch is connected to the second variable-impedance device.

9. The circuit of claim 8 wherein the coupling circuit comprises a transistor connected between the input and output terminals, the transistor having a control terminal connected to a control terminal of the first variable impedance device and to the first output terminal of the latch.

10. A circuit comprising:
    an output terminal;
    a first terminal;
    a first programmable element connected between the first terminal and the output terminal;
    a first variable-impedance device connected between the first terminal and the output terminal in series with the first programmable element;
    a second terminal;

a second programmable element connected between the second terminal and the output terminal:

a second variable-impedance device connected between the second terminal and the output terminal in series with the second programmable element;

an input terminal;

a coupling circuit for controllably coupling the input terminal to the output terminal;

and a plurality of memory cells, wherein a signal on the output terminal selects or deselects one or more memory cells, and wherein:

(1) when the first programmable element is conductive, the variable-impedance device is in its low-impedance state, the second programmable element is non-conductive, and the coupling circuit decouples the input and output terminals, then the output terminal provides a signal selecting the one or more memory cells; and (2) when the second programmable element is conductive, the second variable-impedance device is in its low-impedance state, the first programmable element is non-conductive, and the coupling circuit decouples the input and output terminals, then the output terminal provides a signal deselecting the one or more memory cells.

11. The circuit of claim 1 further comprising a second selection circuit comprising:

a second output terminal for providing a second signal to select the one or more second cells, wherein when the second signal deselects the one or more second cells, the second signal does not block selection of the one or more first cells;

a third programmable path connected to the first terminal and the second output terminal, the third programmable path including a third programmable element connected between the first terminal and the second output terminal such that when the third programmable element is conductive, the third programmable path is enabled to connect the first terminal to the second output terminal, and when the third programmable element is non-conductive, the third programmable path is unable to connect the second terminal to the second output terminal; and a fourth programmable path connected to the second terminal and the second output terminal, the fourth programmable path including a fourth programmable element connected between the second terminal and the second output terminal such that when the fourth programmable element is conductive, the fourth programmable path is enabled to connect the second terminal to the second output terminal, and when the fourth programmable element is non-conductive, the fourth programmable path is unable to connect the second terminal to the second output terminal;

wherein when the third programmable path does not connect the second output terminal to the first terminal and the fourth programmable path does not connect the second output terminal to the second terminal, the second signal is responsive to the one or more address signals to select and deselect the one or more second cells in response to the one or more address signals;

when the third programmable path connects the second output terminal to the first terminal but the fourth programmable path does not connect the second output terminal to the second terminal, the second signal is operable to select the one or more second cells irrespective of the one or more address signals; and when the third programmable path does not connect the second output terminal to the first terminal but the fourth programmable path connects the second output terminal to the second terminal, the second signal is operable to deselect the one or more second cells irrespective of the one or more address signals.

12. A circuit that can be programmed to couple an input signal to an output terminal or alternatively to provide any one of at least two different signals on the output terminal, the circuit comprising:

said output terminal;

an input terminal for receiving said input signal;

a coupling circuit for coupling the input terminal to the output terminal such that when said coupling circuit is enabled, an output signal on the output terminal is at all times indicative of the input signal on the input terminal, and when the coupling circuit is disabled, the coupling circuit decouples the output terminal from the input terminal;

a programmable latch which is programmable to either enable or disable the coupling circuit;

a first terminal for receiving a signal;

a second terminal for receiving a signal;

a first programmable element connected between the first terminal and the output terminal, for coupling said first terminal to the output terminal and thus providing one of said at least two different signals on the output terminal when the coupling circuit is disabled; and a second programmable element connected between the second terminal and the output terminal, for coupling said second terminal to the output terminal and thus providing another one of said at least two different signals on the output terminal when the coupling circuit is disabled.

13. The circuit of claim 12 wherein the circuit is part of an integrated memory having one or more memory cells, wherein the input signal is a select signal for selecting the one or more memory cells, and:

when the coupling circuit is enabled, the select signal on the input terminal is enabled to select the one or more memory cells and is also enabled to deselect the one or more memory cells;

when the coupling circuit is disabled, the select signal is disabled from selecting and deselecting the one or more memory cells, and:

(1) when the first programmable element is conductive but the second programmable element is non-conductive, the one or more memory cells are always selected by said one of said at least two different signals on the output terminal in memory access operations; and (2) when the first programmable element is non-conductive and the second programmable element is conductive, the one or more memory cells are always deselected by said another one of said at least two different signals in memory access operations.

14. The circuit of claim 13 wherein one of the first and second terminals is for receiving a power supply voltage, and the other one of the first and second terminals is for receiving a reference voltage.

15. The circuit of claim 14 wherein the power supply voltage is a positive voltage, and the reference voltage is a ground voltage.

16. The circuit of claim 12 wherein when the coupling circuit is enabled the coupling circuit creates a conductive path between the input terminal and the output terminal.

17. The circuit of claim 12 wherein each of the first and second programmable elements is a fuse, and the circuit further comprises:
    a first transistor connected between the first terminal and the output terminal in series with the first programmable element; and
    a second transistor connected between the second terminal and the output terminal in series with the second programmable element;
    wherein the first and second transistors are controlled by the latch so that when the latch enables the coupling circuit, the first and second transistors are non-conductive, and when the latch disables the coupling circuit, the first and second transistors are conductive so that the signal on the output terminal is determined by states of the first and second programmable elements.

18. The circuit of claim 17 wherein the coupling circuit is a transmission gate comprising a PMOS transistor and an NMOS transistor connected in parallel to the input terminal and the output terminal.

19. The circuit of claim 18 wherein a state of the output terminal is completely determined by states of the programmable latch and the first and second programmable elements, by signals on the first and second terminals, and, if the coupling circuit is enabled, by the signal on the input terminal.

20. The circuit of claim 19 wherein the latch essentially consists of two fuses and two transistors.

21. The circuit of claim 12 wherein a state of the output terminal is completely determined by states of the programmable latch and the first and second programmable elements, by signals on the first and second terminals, and, if the coupling circuit is enabled, by the signal on the input terminal.

22. The circuit of claim 12 wherein the latch is fuse programmable.

23. A circuit comprising:
    an output terminal;
    an input terminal for receiving an input signal;
    a first terminal for receiving a constant voltage;
    a second terminal for receiving a reference voltage;
    a first PMOS transistor and a first NMOS transistor connected in parallel to the input terminal and the output terminal, to provide a conductive path between the input and output terminals;
    a second PMOS transistor and a first programmable element connected in series between the first terminal and the output terminal;
    a second NMOS transistor and a second programmable element connected in series between the second terminal and the output terminal; and
    a programmable latch having a first latch output terminal and a complementary second latch output terminal which provide complementary signals, wherein the first latch output terminal is connected to the gate of the first NMOS transistor and the gate of the second PMOS transistor, and wherein the second latch output terminal is connected to the gate of the first PMOS transistor and the gate of the second NMOS transistor.

24. The circuit of claim 23 wherein the programmable latch further comprises:
    a constant voltage terminal for receiving a constant voltage;
    a reference voltage terminal for receiving a reference voltage;
    an NMOS transistor connected between the first latch output terminal and the reference voltage terminal;
    a first programmable element connected between the constant voltage terminal and the first latch output terminal;
    a PMOS transistor connected between the constant voltage terminal and the second latch output terminal; and
    a second programmable element connected between the second latch output terminal and the reference voltage terminal;
    wherein the gate of the PMOS transistor of the latch is connected to the first latch output terminal and the gate of the NMOS transistor of the latch is connected to the second latch output terminal.

25. A method for configuring a memory, the memory comprising:
    one or more first memory cells;
    one or more second memory cells;
    a first terminal;
    a second terminal; and
    a first selection circuit comprising:
    a first output terminal for providing a first signal to select the one or more first cells, wherein when the first signal deselects the one or more first cells, the first signal does not block selection of the one or more second cells;
    a first programmable path connected to the first terminal and the first output terminal, the first programmable path including a first programmable element connected between the first terminal and the first output terminal such that when the first programmable element is conductive, the first programmable path is enabled to connect the first terminal to the first output terminal, and when the first programmable element is non-conductive, the first programmable path is unable to connect the first terminal to the first output terminal; and
    a second programmable path connected to the second terminal and the first output terminal, the second programmable path including a second programmable element connected between the second terminal and the first output terminal such that when the second programmable element is conductive, the second programmable path is enabled to connect the second terminal to the first output terminal, and when the second programmable element is non-conductive, the second programmable path is unable to connect the second terminal to the first output terminal;
    the method comprising:
    testing the first and second memory cells;
    if the testing establishes that the first and second cells are to be enabled for normal operation, then configuring the memory so that during normal operation the first and second programmable paths are permanently disabled and the first signal is responsive to the one or more address signals to select and deselect the one or more first cells;
    if the testing establishes that the first one or more cells are to be enabled for normal operation and the second one or more cells are to be disabled for normal operation, then having the first programmable element to be conductive and the second programmable element to be non-conductive so that during normal operation the first programmable path is permanently enabled and the second programmable path is permanently disabled, and also decoupling the first signal from the one or more address signals; and if the testing establishes that the first one or more cells are to be disabled for normal operation, then having the first programmable element to be non-conductive and the second programmable element to be conductive so that during normal operation the first programmable path is permanently disabled and the second programmable path is permanently enabled, and also decoupling the first signal from the one or more address signals.

26. The method of claim 25 wherein the memory further comprises:

a second output terminal for providing a second signal to select the one or more second cells, wherein when the second signal deselects the one or more second cells, the second signal does not block selection of the one or more first cells;

a third programmable path connected to the first terminal and the second output terminal, the third programmable path including a third programmable element connected between the first terminal and the second output terminal such that when the third programmable element is conductive, the third programmable path is enabled to connect the first terminal to the second output terminal, and when the third programmable element is non-conductive, the third programmable path is unable to connect the first terminal to the second output terminal; and a fourth programmable path connected to the second terminal and the second output terminal, the fourth programmable path including a fourth programmable element connected between the second terminal and the second output terminal such that when the fourth programmable element is conductive, the fourth programmable path is enabled to connect the second terminal to the second output terminal, and when the fourth programmable element is non-conductive, the fourth programmable path is unable to connect the second terminal to the second output terminal; and the method further comprises:

if the testing establishes that the first and second cells are to be enabled for normal operation, then configuring the memory so that during normal operation the third and fourth programmable paths are permanently disabled and the second signal is responsive to the one or more address signals to select and deselect the one or more first cells;

if the testing establishes that the second one or more cells are to be disabled for normal operation, then having the third programmable element to be non-conductive and the fourth programmable element to be conductive so that during normal operation the third programmable path is permanently disabled and the fourth programmable permanently enabled, and also decoupling the second signal from the one or more address signals; and if the testing establishes that the first one or more cells are to be disabled for normal operation and the second one or more cells are to be enabled for normal operation, then having the third programmable element to be conductive and the second programmable element to be non-conductive so that during normal operation the third programmable path is permanently enabled and the fourth programmable path is permanently disabled, and also decoupling the second signal from the one or more address signals.

27. The method of claim 26 wherein when the first and second signals are responsive to the one or more address signals, the first and second signals are complements of each other.

* * * * *

UNITED STATES PATENT AND TRADEMARK OFFICE
CERTIFICATE OF CORRECTION

PATENT NO. : 5,889,414
DATED : 03/30/99
INVENTOR(S) : Li, Li-Chun; Watters, Lynne; Fang, Sharlin It is certified that error appears in the above-identified patent and that said Letters Patent is hereby corrected as shown below:

Col. 4, line 22, change "signal A" to --"signal $\bar{A}$ --;
Col. 4, line 22, change "A, A" to --A, $\bar{A}$-- .
Col. 4, line 25, change "A, A" to --A, $\bar{A}$--.

Signed and Sealed this

Tenth Day of October, 2000

*Attest:*

Q. TODD DICKINSON

*Attesting Officer*    *Director of Patents and Trademarks*